(12) United States Patent
Ertosun

(10) Patent No.: US 8,659,931 B1
(45) Date of Patent: Feb. 25, 2014

(54) ERASE AND SOFT PROGRAM WITHIN THE ERASE OPERATION FOR A HIGH SPEED RESISTIVE SWITCHING MEMORY OPERATION WITH CONTROLLED ERASED STATES

(75) Inventor: Mehmet Günhan Ertosun, San Francisco, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 43 days.

(21) Appl. No.: 13/488,392

(22) Filed: Jun. 4, 2012

Related U.S. Application Data

(60) Provisional application No. 61/572,212, filed on Jul. 13, 2011.

(51) Int. Cl.
*G11C 11/00* (2006.01)

(52) U.S. Cl.
USPC .......................................... 365/148; 365/163

(58) Field of Classification Search
USPC ................................................ 365/148, 163
See application file for complete search history.

(56) References Cited

U.S. PATENT DOCUMENTS

2008/0112207 A1* 5/2008 Pinnow .......................... 365/148

* cited by examiner

*Primary Examiner* — Huan Hoang
(74) *Attorney, Agent, or Firm* — Michael C. Stephens, Jr.

(57) ABSTRACT

Structures and methods of operating a programmable impedance element are disclosed herein. In one embodiment, a method of operating a programmable impedance element can include: (i) determining an operation to be performed on the programmable impedance element, where the programmable impedance element includes a solid electrolyte between an active electrode and an inert electrode; (ii) in response to the determined operation being a program operation, programming the programmable impedance element by completing formation of a conductive path from a partial conductive path between the active and inert electrodes; and (iii) in response to the determined operation being an erase operation, erasing the programmable impedance element by substantially dissolving the conductive path, and then by forming the partial conductive path.

18 Claims, 9 Drawing Sheets

ERASE AND SOFT PROGRAM WITHIN THE ERASE OPERATION FOR A HIGH SPEED RESISTIVE SWITCHING MEMORY OPERATION WITH CONTROLLED ERASED STATES

RELATED APPLICATIONS

This application claims the benefit of U.S. Provisional Application No. 61/572,212, filed Jul. 13, 2011, which is incorporated herein by reference in its entirety.

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high programming current, as well as physical degradation of the memory cell over time. Other NVM technologies, such as resistive RAM (ReRAM) and conductive bridging RAM (CBRAM), may offer relatively low power and higher speeds as compared to flash memory technologies. CBRAM utilizes a programmable metallization cell (PMC) technology, which has the potential to scale to smaller sizes than flash memory devices.

SUMMARY

Embodiments of the present invention relate to a programmable impedance element with an erase operation that includes a soft program operation.

In one embodiment, a method of operating a programmable impedance element can include: (i) determining an operation to be performed on the programmable impedance element, where the programmable impedance element includes a solid electrolyte between an active electrode and an inert electrode; (ii) in response to the determined operation being a program operation, programming the programmable impedance element by completing formation of a conductive path from a partial conductive path between the active and inert electrodes; and (iii) in response to the determined operation being an erase operation, erasing the programmable impedance element by substantially dissolving the conductive path, and then by forming the partial conductive path.

In another embodiment, a programmable impedance element can include: (i) a solid electrolyte; (ii) an inert electrode coupled to a first side of the solid electrolyte; (iii) an active electrode coupled to a second side of the solid electrolyte, where the programmable impedance element is configured to be programmed by completing formation of a conductive path from a partial conductive path between the active and inert electrodes; and (iv) where the programmable impedance element is configured to be erased by substantially dissolving the conductive path and then by forming the partial conductive path. A memory cell can also be formed with the programmable impedance element and a transistor.

Embodiments of the present invention can advantageously provide for a more controlled erase operation relative to conventional approaches. Particular embodiments are suitable for resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
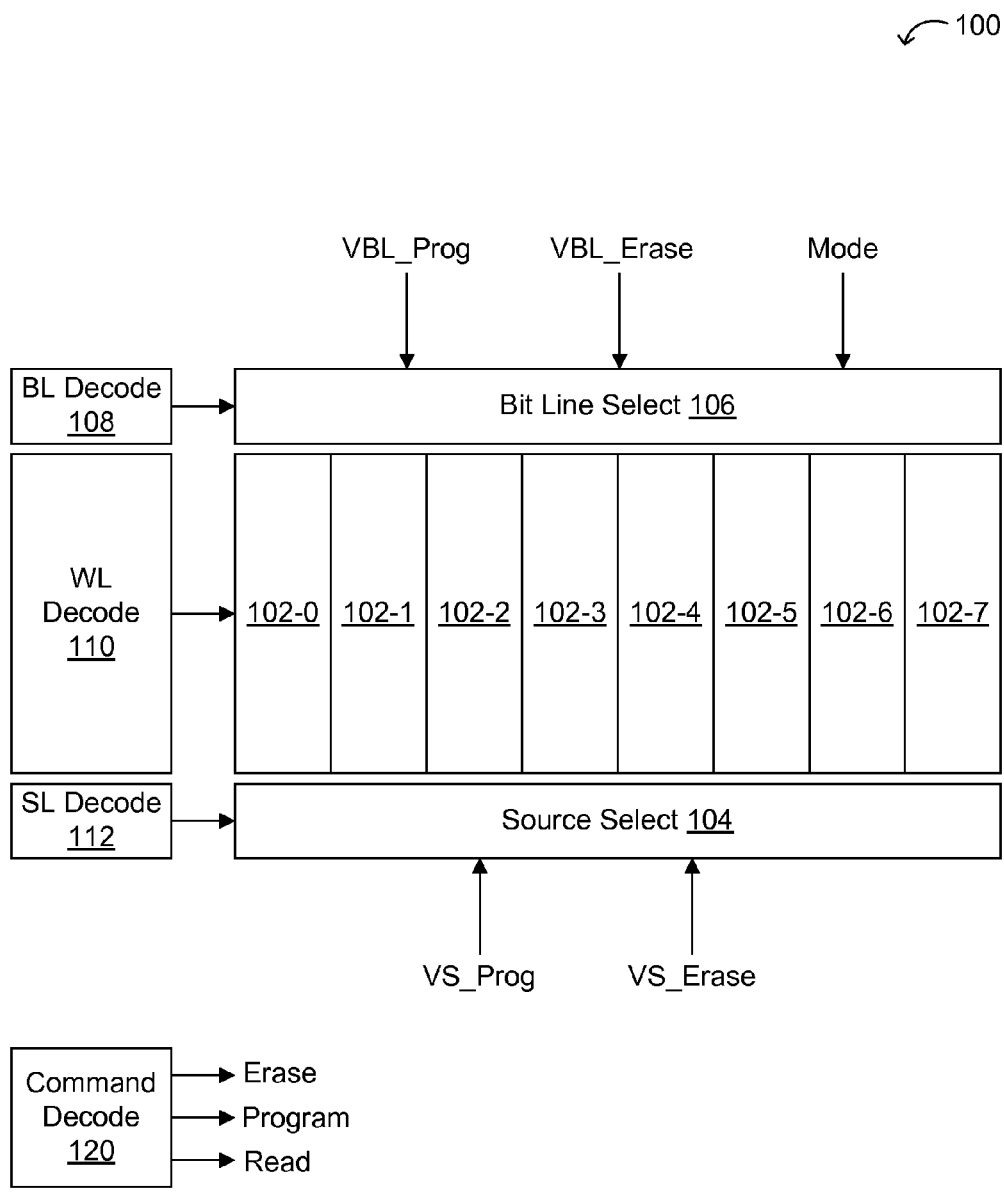
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of fabricating PMCs that can be programmed/written and erased between one or more resistance and/or capacitive states.

Figure 2:
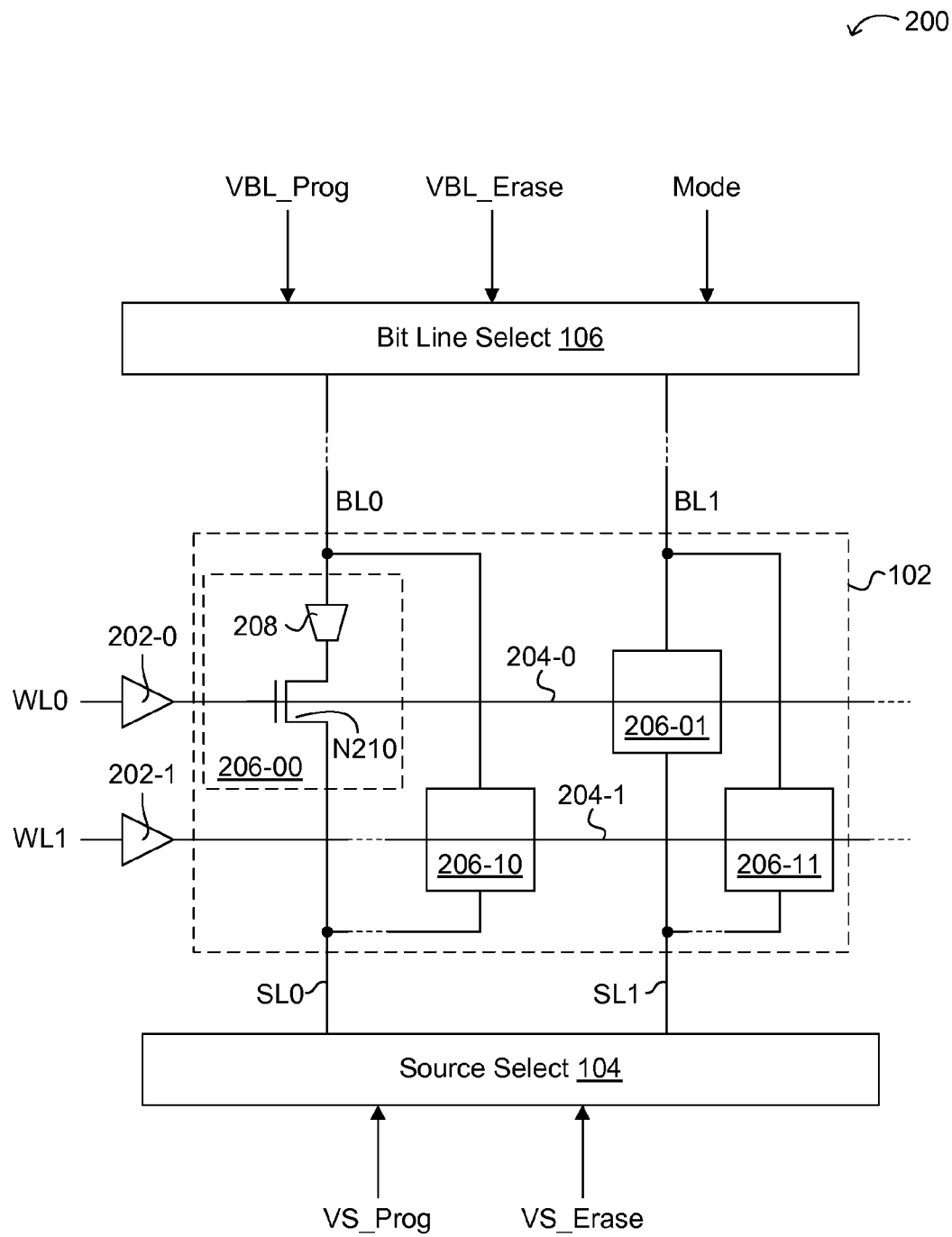
FIG. 2 is a schematic block diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1–V2) in an anode-to-cathode direction. In an erase operation, a PMC to be erased can be connected between suitable voltages (e.g., V2–V1) in an anode-to-cathode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be an erase voltage, which may both be a supply voltage (Vprog=V1–V2, Verase=V2–V1, Supply voltage=V2–V1). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell, thus placing its corresponding select device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltage and/or currents to enable such access devices. In this way, bit line selection, source selection, and word line activation can be utilized to program and/or erase a PMC array having bit lines connected to anodes of PMCs within multiple memory cells.

In particular embodiments, the erase operation can include a "strong" erase operation that substantially dissolves a conductive path and maximizes a cell resistance, followed by a "soft" program operation that creates a partial or a weaker conductive path. In this way, a more controlled erase operation and cell off resistance variation for a programmable impedance element can be provided.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
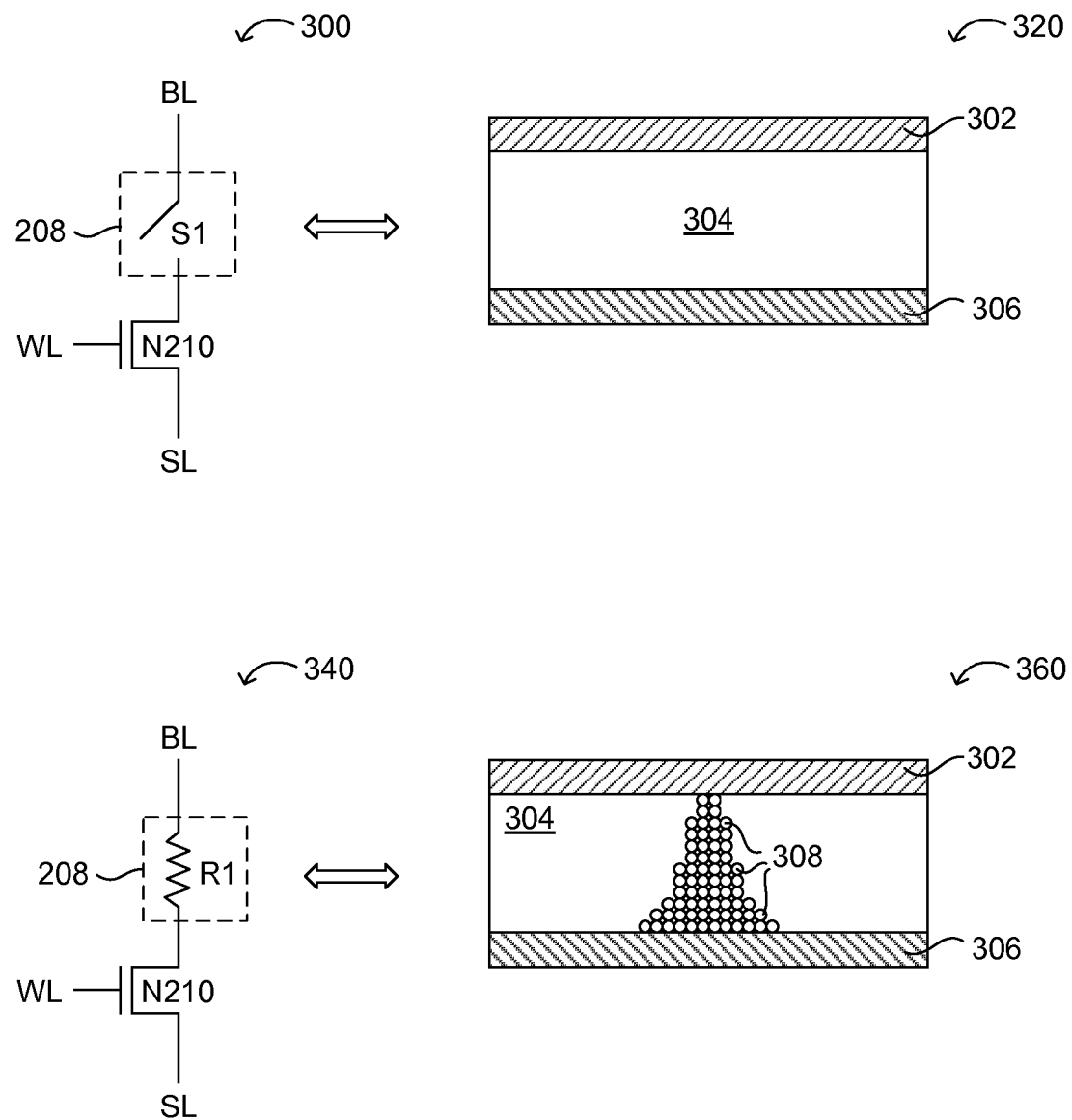
FIG. 3 is a diagram of an example programmable impedance element with schematic modeling.

Referring now to FIG. 3, shown is a diagram of an example programmable impedance element with schematic modeling. For example, example 300 shows a memory cell with an open switch 51 representation of PMC 208. The PMC portion of this representation corresponds to the cross-section diagram 320, which represents a PMC or programmable impedance element in a high impedance state (e.g., state "0"), or an erased state. As used herein, "PMC" may be one example of a "programmable impedance element." PMC 320 can include electrochemically active electrode 302, solid electrolyte 304, and inert electrode 306. The example PMC 320 may represent a strong or substantially erased state of the cell. As shown, substantially no conductive path between active electrode 302 and inert electrode 306 is seen in PMC 320.

Schematic representation 340 and corresponding cross-section diagram 360 show examples of PMC 208 in a low impedance state (e.g., state "1"), or a programmed state. For example, example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in example PMC 360, a full conductive path may be formed between active electrode 302 and inert electrode 306 by electrodeposits 308.

As shown in examples 300 and 340, a control transistor (e.g., N210) can also be included in each memory cell including the programmable impedance element or PMC 208. For example, transistor N210 can be controlled by a word line 204, as discussed above with respect to FIG. 2. Transistor N210 may be an access transistor to allow PMC 208 to be programmed and erased (e.g., including a strong erase followed by a soft program operation).

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Various materials can be utilized to form electrodes 302 and 306. For example, inert electrode 306 can include tungsten, and electrochemically active electrode 302 can include silver or copper. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 $\mu$A). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell writing, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC may be substantially symmetric to a program or write operation. However, in particular embodiments the erase operation can also include a soft program operation that forms a partial or a weaker conductive path of electrodeposits 308 in solid electrolyte 304.

Thus in conductive bridging random-access memory (CBRAM) applications, metal ions can dissolve readily in the material (e.g., 304) between the two electrodes (e.g., 302 and 306). In contrast, in resistive RAM (ReRAM) applications, the material between the electrodes may require a high electric field that can cause local damage in may produce a trail of conducting defects (a "filament"). Thus, for CBRAM, one electrode provides the dissolving ions, while for ReRAM, a one-time "forming" step may be required to generate the local damage.

Example Strong Erase and Soft Program Operation

Figure 4:
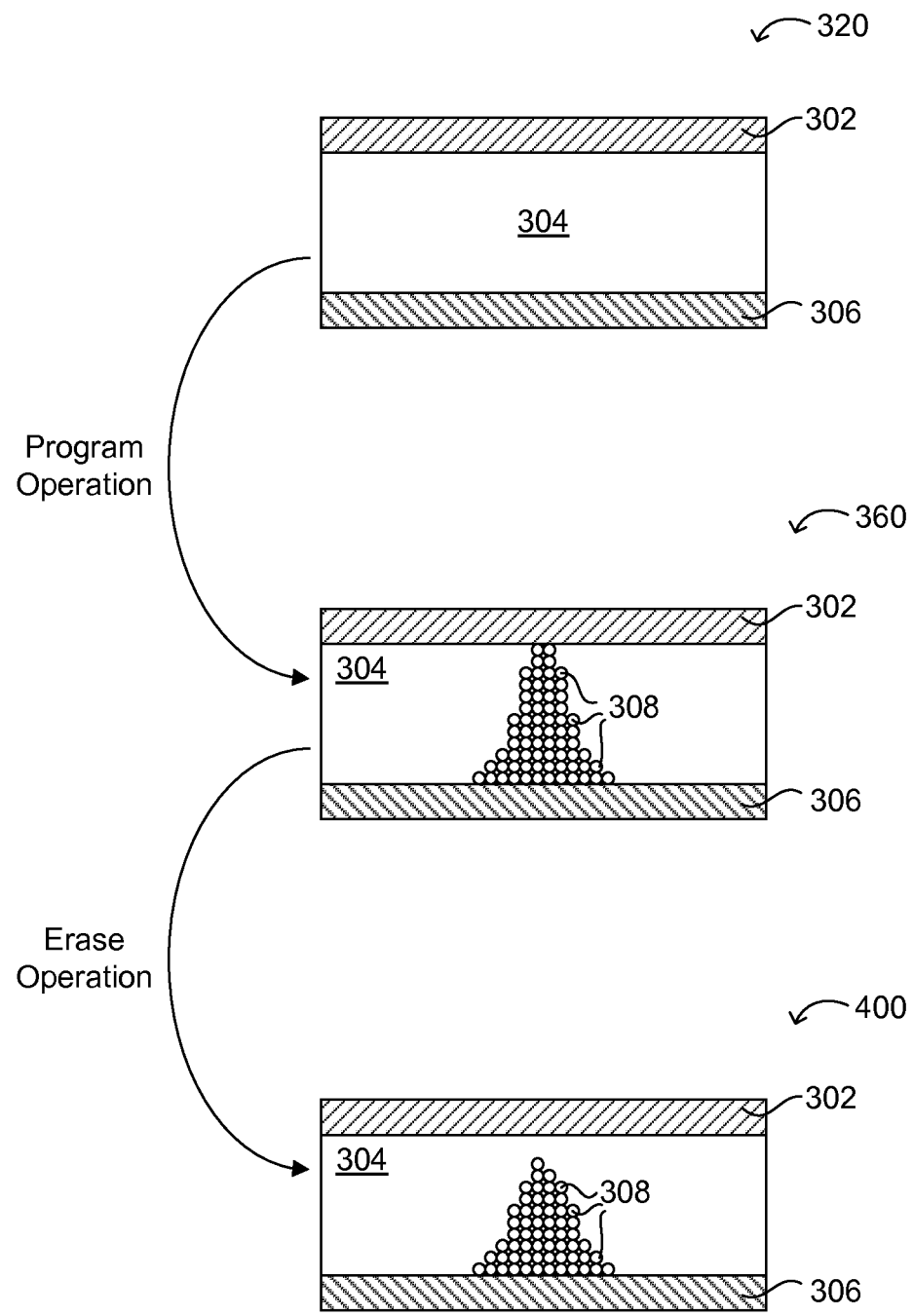
FIG. 4 is a diagram showing example program and erase operations.

Referring now to FIG. 4, shown is a diagram of example program and erase operations. Example PMC 320 shows a "virgin" state, which may also be a substantially erased to represent a "0" data value or data state. After a regular program operation, and as shown in 360, the programmable impedance element may have a full conductive path of electrodeposits 308 between active electrode 302 and inert electrode 306. After an erase operation, the programmable impedance element may appear as in example 400, whereby some of electrodeposits 308 remain in solid electrolyte 304, but the conductive path between electrodes 302 and 306 is partially dissolved, and thus broken.

This particular resistive switching memory (e.g., PMC, programmable impedance element, etc.) works as shown in FIG. 4, with a relation as shown below in Equation 1.

$V_{cell}$=cell voltage;
$V_{EAE}$=voltage at the electrochemically active electrode;
$V_{IE}$=voltage at the inert electrode;

$$V_{cell} = V_{EAE} - V_{IE} \quad (1)$$

A positive $V_{cell}$ may be applied to the storage cell for a program operation, and a negative $V_{cell}$ may be applied for an erase operation. A conductive filament (e.g., of electrodeposits 308) can be formed during the program operation (e.g., in going from example 320 to example 360). After programming whereby the conductive path is formed between electrodes 302 and 306, the programmable impedance element may be in a relatively low resistance state (e.g., state "1"). During the erase operation (e.g., in going from example 360 to example 400), this filament or conductive path may be broken, and as a result the programmable impedance element may enter a relatively high resistance state (e.g., state "0").

Figure 5:
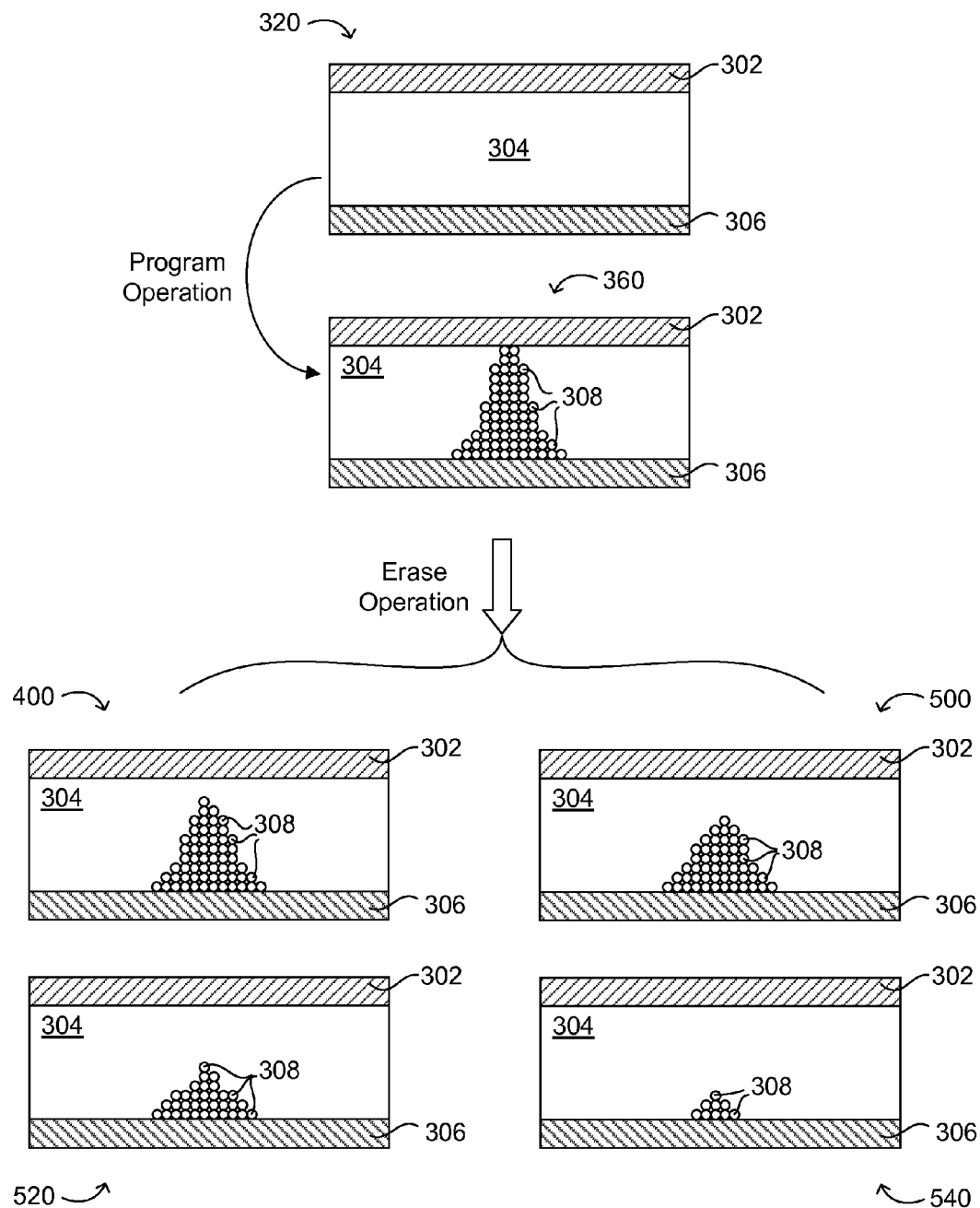
FIG. 5 is a diagram showing an example erase problem with different levels of filament breaking in the erase operation.

Referring now to FIG. 5, shown is a diagram of an example erase problem with different levels of filament/conductive bridge breaking in the erase operation. While the program operation (e.g., from example 320 to example 360) may be relatively easy to control, the erase operation can be difficult to control. Difficulty in controlling the erase operation may result in a variation in the erased states (state "0" values). FIG. 5 illustrates this problem whereby variation may occur in how much of the filament or conductive bridge/path is broken. For example, after an erase operation, electrodeposits 308 may remain in a mostly formed filament in example 400, while fewer electrodeposits 308 may remain in a less formed filament/conductive bridge in example 500. Other erased state examples are shown in 520 and 540, whereby even fewer electrodeposits 308 may remain after an erase operation.

In some applications, this type of erase operation variation can cause problems, such as variation in the consecutive time-to-program, as well as state resistance distribution variances. These variations can increase challenges in forming a high performance memory array. In addition, the time-to-erase values may be faster than the time-to-program values, possibly causing an undesirable asymmetry between the program and erase operations. Other design challenges involved in obtaining fast operating devices include a previous high resistance state and a condition of the filament affecting consecutive time-to-program values.

Thus, it may be difficult to control the erase operation in resistive memories (e.g., PMCs), resulting in variation in the time-to-program and data state resistance values. Further, formation of a high-performance memory array can be more difficult due to such relatively wide distributions. In addition, the erase operation that is faster than a program operation may cause asymmetric operation. Finally, relatively fast time-to-program values may be difficult to attain in approaches used in conventional programmable impedance element operation.

By using "stronger" erase voltages, one can erase programmable impedance element based cells back to their virgin states, or to a state substantially close to their virgin states, whereby the filament or conductive bridge between electrodes 302 and 306 is substantially removed. However, the programming of such substantially or fully erased cells can take longer than a corresponding partially erased cell. Thus, it may not be desirable to fully erase the cells during a memory operation when the subsequent operation is a regular program operation.

Figure 6:
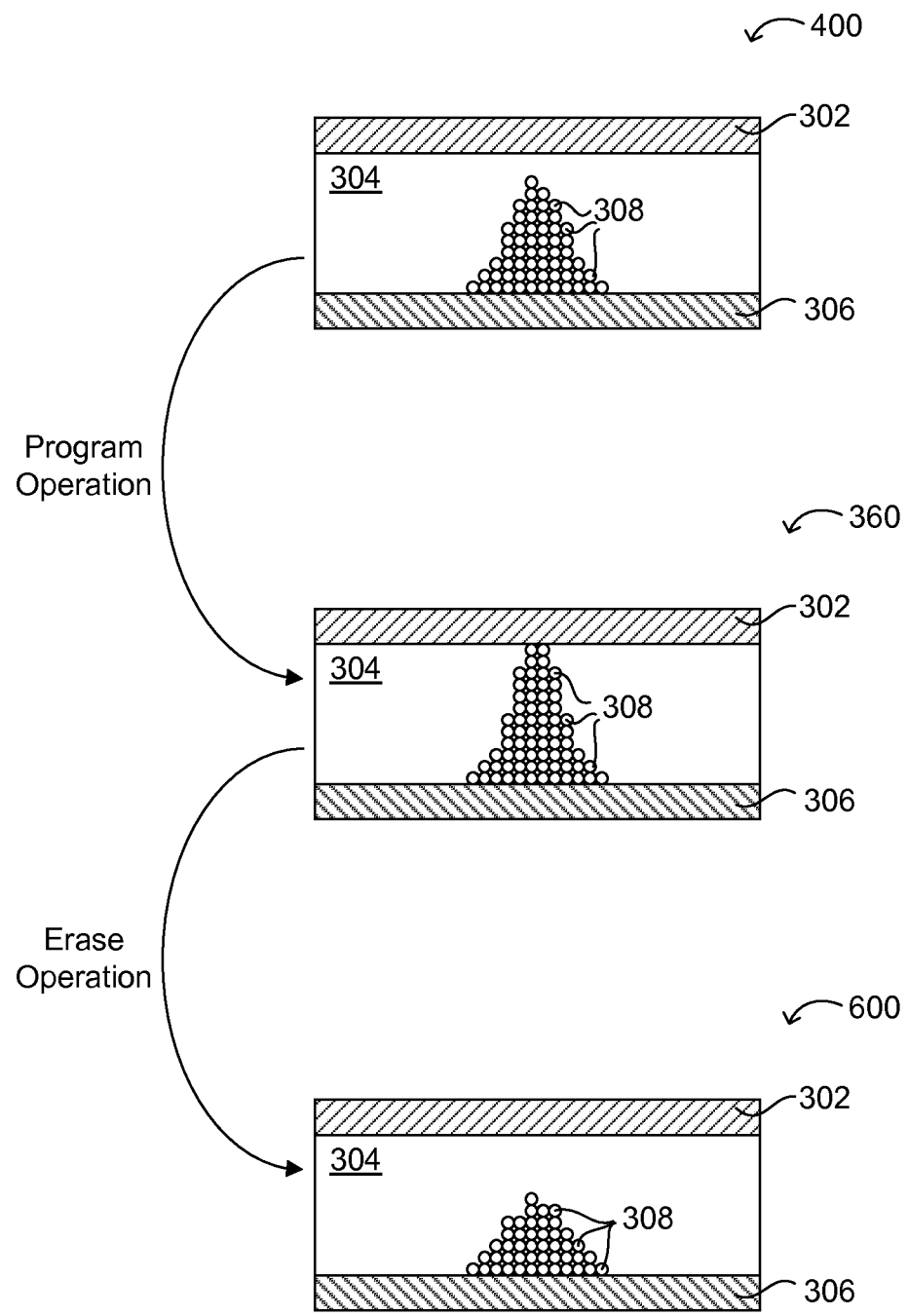
FIG. 6 is a diagram of an example cycling between a '0' data state, a '1' data state, and another '0' data state.

In particular embodiments, a modified erase scheme can include a strong erase operation followed by a soft program operation (Modified Erase=Strong Erase+Soft Program), and a standard program operation (Program=Regular Program) can be used. The difference between the modified erase operation in particular embodiments and a conventional approach can be seen with respect to the examples of FIGS. 6 and 8. FIG. 6 shows an example case with conventional program and erase mechanisms, with an example cycling between a "0" data state, a "1" data state, and another "0" data state.

In the particular example of FIG. 6, a partial conductive path is shown in example 400, and a program operation may result in a full conductive path as shown in example 360. An erase operation may result in the example of 600, whereby some electrodeposits 308 may remain. Thus, the erase operation shown here may not be a strong erase whereby electrodeposits 308 are substantially removed. In addition, while examples 400 and 600 may both represent "0" data states stored in the cells due to the broken conductive path between electrodes 302 and 306, example 400 shows more of a conductive path formed than example 600. Thus, there is a resistance variation between examples 400 and 600, and subsequent programming times may also vary accordingly.

In one embodiment, a method of operating a programmable impedance element can include: (i) determining an operation to be performed on the programmable impedance element, where the programmable impedance element includes a solid electrolyte between an active electrode and an inert electrode; (ii) in response to the determined operation being a program operation, programming the programmable impedance element by completing formation of a conductive path from a partial conductive path between the active and inert electrodes; and (iii) in response to the determined operation being an erase operation, erasing the programmable impedance element by substantially dissolving the conductive path, and then by forming the partial or a weaker conductive path.

Figure 7:
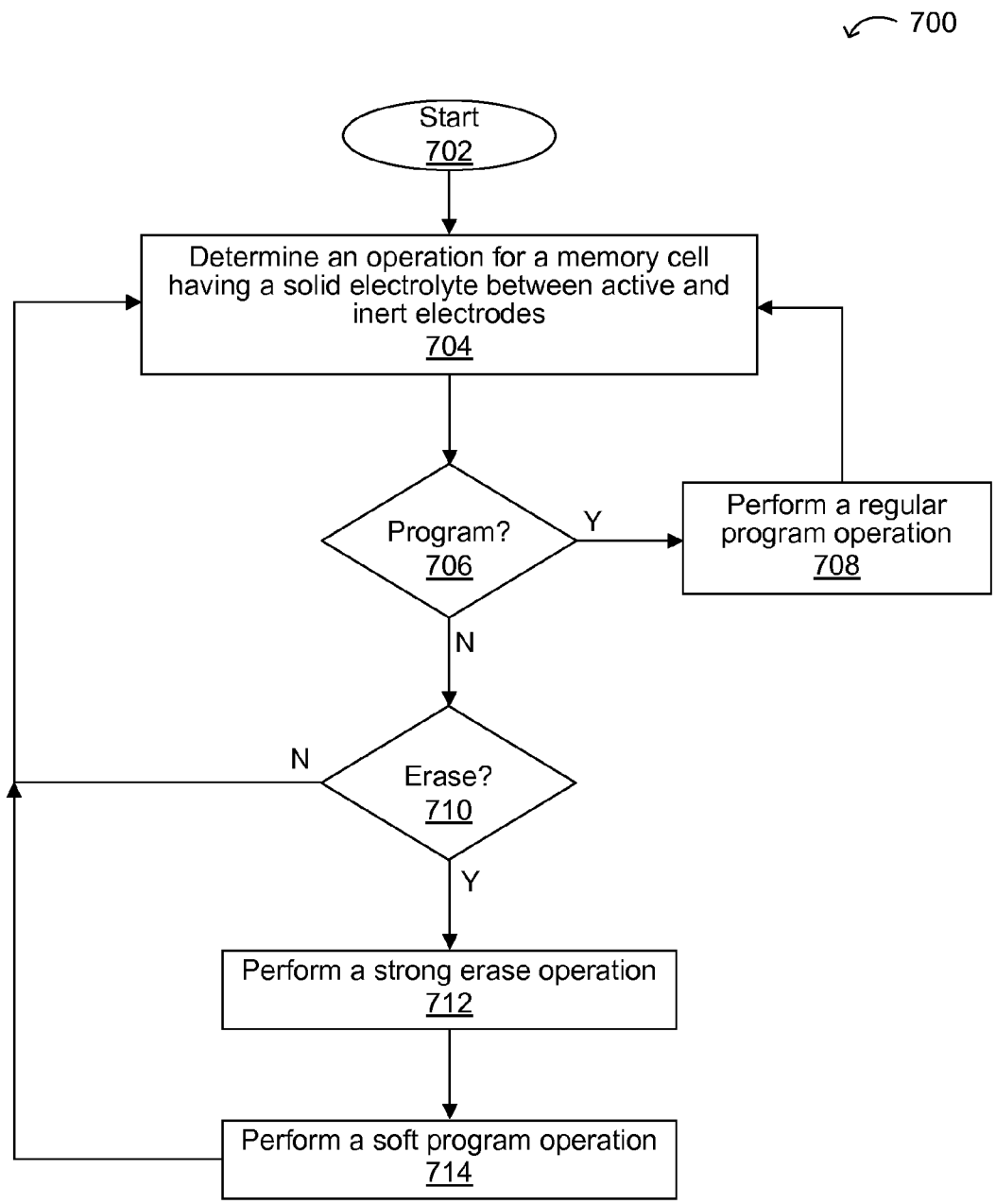
FIG. 7 is a flow diagram of an example method of operating a programmable impedance device in accordance with embodiments of the present invention.

Referring now to FIG. 7, shown is a flow diagram 700 of an example method of operating a programmable impedance device in accordance with embodiments of the present invention. The flow begins 702, and a determination of an operation for a memory cell can be made at 704. The memory cell can include a programmable impedance element having a solid electrolyte 304 between active 302 and inert electrodes 306. The operation to be performed can be determined by a control block (e.g., command decode circuitry 120) coupled to or included within memory device 100. For example, commands from a memory controller can be supplied to memory device 100, and such commands may be decoded by command decode circuitry 120 to determine whether a memory device 100 is to perform a particular operation (e.g., program, erase, read, etc.). In addition, address information for identifying the particular memory cell 206, and associated PMC

208 therein, on which the operation is to be performed, may also be supplied along or in association with the commands.

If the operation is determined to be a program operation (706), a regular program operation may be performed at 708. For example, the program operation can include completing a conductive path (e.g., from 400 to 360, as shown in FIG. 6) by applying voltages (e.g., VBL_Prog, VS_Prog, etc.) such that metal ions from active electrode 302 can be oxidized and then reduced in solid electrolyte 304 to form electrodeposits 308. After the program operation at 708 is completed, the flow can return to determining another operation for the memory cell at 704.

If the operation is determined to be an erase operation (710), a strong erase operation can be performed at 712, followed by a soft program operation at 714. The strong erase operation may substantially remove the filament or conductive path between electrodes 302 and 306. For example, the strong erase operation can include removing a conductive path by applying voltages (e.g., VBL_Erase, VS_Erase, etc.) such that electrodeposits 308 are dissolved. The soft program operation may then be performed in order to create a partial conductive path between electrodes 302 and 306. For example, the soft program operation can include forming a partial conductive path by applying voltages (e.g., VBL_Prog, VS_Prog, etc.) such that metal ions from active electrode 302 can be oxidized and then reduced in solid electrolyte 304 to form electrodeposits 308. As will be discussed in more detail below, the voltages (e.g., VBL_Prog, VS_Prog, etc.) and/or currents utilized for the soft program operation may be adjusted and controlled relative to those for a regular program operation.

In another embodiment, a programmable impedance element can include: (i) a solid electrolyte; (ii) an inert electrode coupled to a first side of the solid electrolyte; (iii) an active electrode coupled to a second side of the solid electrolyte, where the programmable impedance element is configured to be programmed by completing formation of a conductive path from a partial conductive path between the active and inert electrodes; and (iv) where the programmable impedance element is configured to be erased by substantially dissolving the conductive path and then by forming the partial or a weaker conductive path. A memory cell can also be formed with the programmable impedance element and a transistor.

Figure 8:
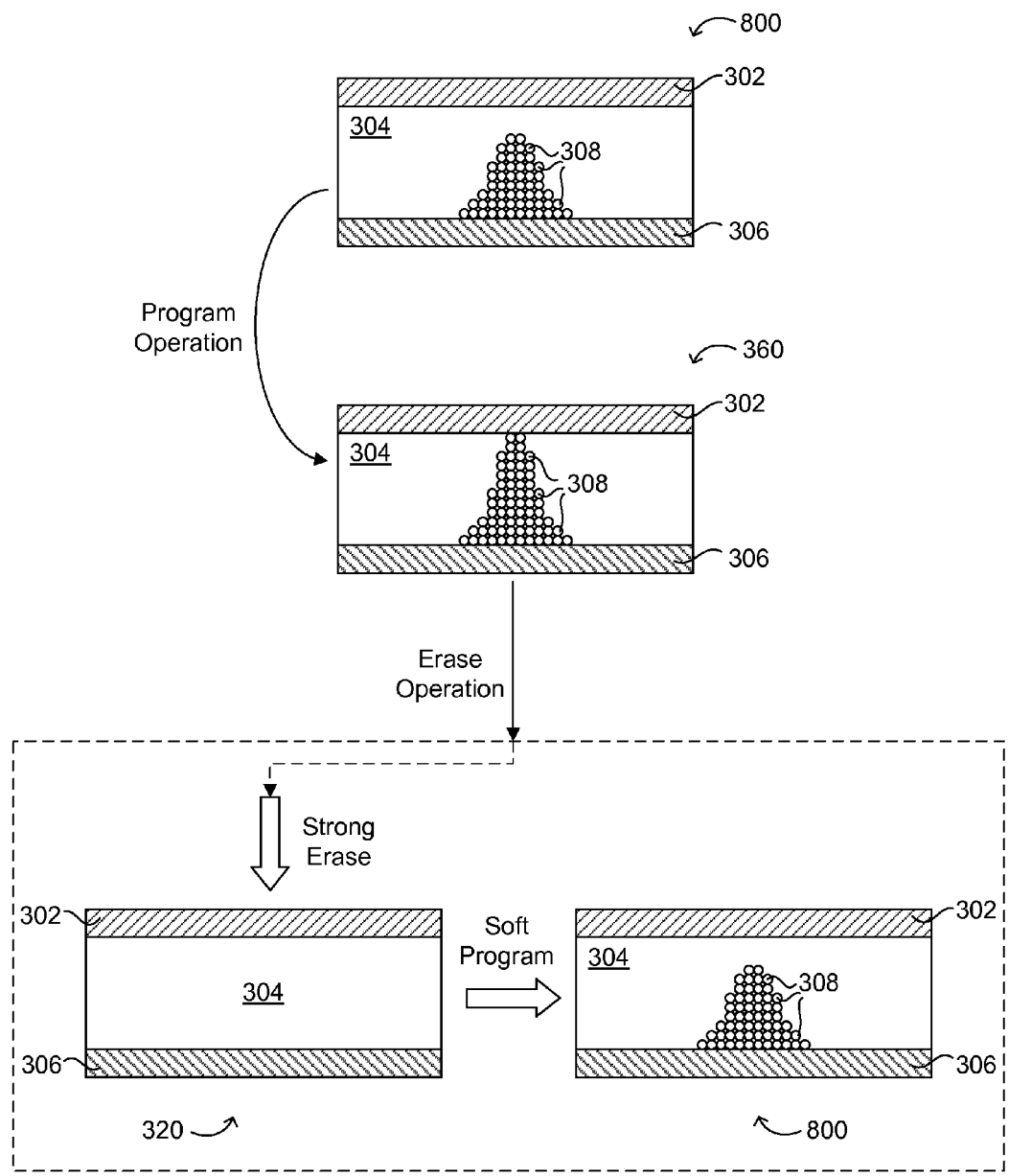
FIG. 8 is a diagram of an example cycling between a '0' data state, a '1' data state, and a '0' data state in accordance with embodiments of the present invention.

Referring now to FIG. 8, shown is a diagram of an example cycling between a "0" data state, a "1" data state, and a "0" data state in accordance with embodiments of the present invention. FIG. 8 shows an example modified erase scheme that includes a strong erase operation followed by a soft program operation, in accordance with particular embodiments. A "0" data state can be as shown in example 800 with a partial conductive path between electrodes 302 and 306 being formed by electrodeposits 308. A program operation may complete the conductive path between electrodes 302 and 306 by formation of additional electrodeposits 308. Thus, a program operation may complete a conductive path from a partial conductive path so as to store a "1" data state, as shown in example 360.

In particular embodiments, an erase operation can include a two-step process of (i) a strong erase operation and (ii) a soft program operation. The strong erase operation may substantially dissolve electrodeposits 308 found in solid electrolyte 304 such that the conductive path between electrodes 302 and 306 is substantially removed, as shown in example 320. The soft program operation may then form a partial or a weaker conductive path of electrodeposits 308, as shown in example 800. Thus, example 800 may represent a return to a "0" data state, as shown in the top of the diagram of FIG. 8. In this way, a more consistent and repeatable data state cycling of a PMC can be attained.

The active electrode in particular embodiments may be an electrochemically active electrode that includes an oxidizable metal. When oxidized, metal ions can be derived from active electrode 302, and these positively charged metal ions may be mobile within solid electrolyte 304 under the influence an electric field (e.g., a bias voltage). Thus, the mobile elements may be positively charged metal ions. The mobile metal ions can then be reduced as part of a reduction electrochemical reaction whereby electrodeposits are formed including the base metal from the active electrode. Electrodeposits 308 reduced from mobile elements/ions can form a remaining part of the conductive path. Thus, electrodeposits 308 can include metal from electrochemically active electrode 302, by way of an oxidation process to produce mobile metal ions, and a reduction process to produce metal electrodeposits 308.

Solid electrolyte 304 can include a chalcogenide compound, such as a germanium selenium (Ge—Se) compound. Solid electrolyte 304 can be formed by photodissolution of metal into a chalcogenide base glass, Chalcogenide materials are chemical compounds consisting of at least one chalcogen ion (a chemical element in column VI of the periodic table, also known as the oxygen family). More precisely, the term chalcogenide refers to the sulphides, selenides, and tellurides, PMCs may utilize the ionic conduction of compounds containing metallic ions.

Certain metals can be added to thin films of chalcogenide glasses by photodissolution. When Ag is combined in this fashion with Ge—Se or Ge—S glasses, the resulting ternary may contain a dispersed nanocrystalline $Ag_2S(e)$ phase that has relatively large quantities of mobile metal ions. The presence of these ions allows the ternaries to act as solid electrolytes. If an anode that has an oxidizable form of the ionic metal and an inert cathode are applied in contact with such a phase-separated electrolyte, an ion current of mobile elements (e.g., positively charged metal ions) can flow under an applied voltage bias, Electrons from the cathode can reduce the excess metal due to the ion flux and an electrodeposit (e.g., 308) forms on or in the electrolyte (e.g., 304). Also, other materials, such as certain oxides (e.g., tungsten oxide, hafnium oxide, nickel oxide, titanium oxide, transition metal oxides, etc.), can be used, as opposed to Ge—S and Ge—Se chalcogenide glasses. In addition, other metals, such as copper, can be used in place of silver, for the electrochemically active electrode that supplies mobile ions.

One example soft program operation can include use of a relatively low/lower program compliance current and a high programming voltage. The resistance state that may be reached during the programming is dependent on the program current ($I_{cc}$) that is used during the soft program operation, as shown below in Equation 2.

$$R_{programmed} = V_{cell}/I_{cc} \qquad (2)$$

The time it takes to achieve a particular programmed state (e.g., a full programmed state 360, a partial program state 800) may depend on the program voltage ($V_{cell}$). At relatively high program voltages, the cell resistance can be quickly brought to the desired resistance state level. Thus, with a high voltage and low current to perform "soft programming," one can bring the programmable impedance element or cell to a state in which the resistance of the cell is controlled in each case. This resistance value can be the $R_{off}$ (high resistance state value) of the memory cell, representing a data value "0" storage state. As a result, one can achieve a very controlled $R_{off}$ value and also possibly engineer the $R_{off}$ values to desired levels. In this fashion, a controlled and a very tight distribution of $R_{off}$ values may be achieved in particular embodiments.

By having controlled erased states (e.g., example 800), and hence controlled $R_{off}$ values, the time-to-program variation during the actual programming operation (e.g., in going from example 800 to example 360) can be minimized. In addition, the program operation can be made faster, as compared to conventional approaches. This is because the conductive path between electrodes 302 and 306 may already be partially or otherwise weakly formed (see, e.g., example 800) by way of the soft program operation after the strong erase operation. In this fashion, by controlling the $R_{off}$ value and bringing the cell to a lower off (or high resistance) state, the time-to-program speed may be substantially improved.

Figure 9:
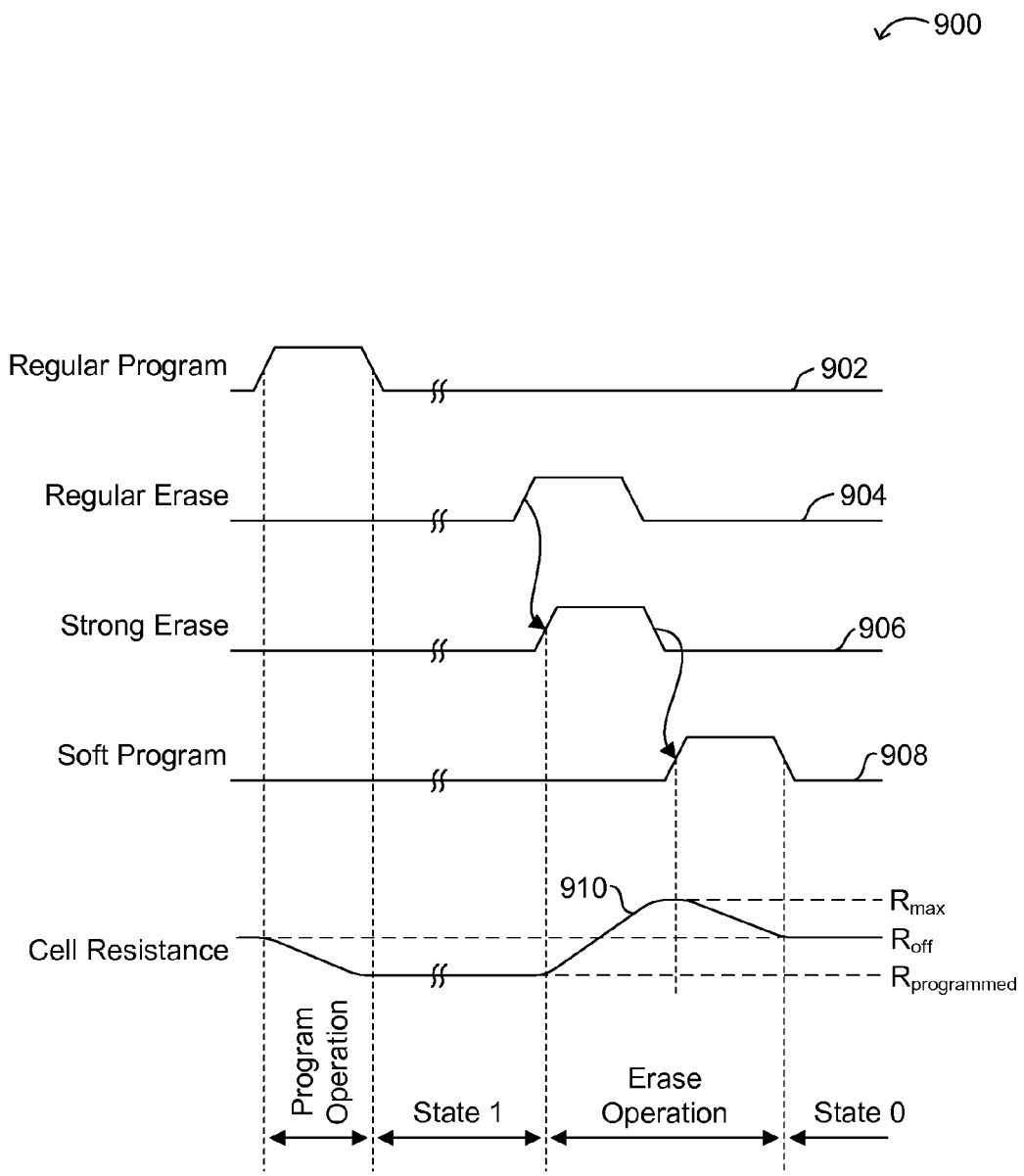
FIG. 9 is a waveform diagram of example program and erase operations in accordance with embodiments of the present invention.

Referring now to FIG. 9, shown is a waveform diagram 900 of example program and erase operations in accordance with embodiments of the present invention. A regular program control signal may be as shown in waveform 902. In this example, the cell may have previously been erased, and thus has a resistance value of $R_{off}$. At this point, the PMC or cell may appear as example 360 with a completed conductive path of electrodeposits 308 between electrodes 302 and 306. Thus, during the program operation, electrodeposits 308 are formed to essentially add to a partial conductive path of electrodeposits 308 (e.g., example 800) to form the completed conductive path (e.g., example 360). As such, the resistance of the cell may be lowered from an erased resistance value of $R_{off}$ to a programmed resistance value of $R_{programmed}$, as shown in waveform 910. As indicated, this programmed resistance value of the cell can correspond to a state "1" data value.

A regular erase control signal may be as shown in waveform 904. In one example, the regular erase control signal may trigger a strong erase control signal, as shown in waveform 906. Of course, these two signals may be combined into one erase control signal. However, having such separate regular erase and strong erase control signals can allow for override controls or the like, such as in a test mode whereby either one of a regular erase or a strong erase operation can be performed. In this particular example, the strong erase operation may be implemented so as to substantially dissolve electrodeposits 308 in solid electrolyte 304, thus removing the conductive path between electrodes 302 and 306. This is shown in example cross-section diagram 320, which may also represent a virgin or virgin-like state of the PMC. Because substantially no electrodeposits 308 are found in solid electrolyte 304 after the strong erase operation, the cell resistance may be increased to its maximum value of $R_{max}$, as shown in waveform 910.

As shown in example waveform 908, the soft program control signal may be triggered in response to an ending of the strong erase cycle (e.g., the strong erase control signal going low). As shown, the erase operation in particular embodiments can include both a strong erase operation and a soft program operation. The soft program operation may form a partial conductive path or an otherwise weaker conductive path in solid electrolyte 304 by oxidation and reduction of metal ions from active electrode 302 to form electrodeposits 308, as shown in example 800. Because a partial or a relatively weaker conductive path is formed, the effective resistance between electrodes 302 and 306 may be lowered. For example, the resistance may be lowered during the soft program operation to return to a value of $R_{off}$ as shown in waveform 910. This value may represent a data state "0" for the erased cell. Further, the resistance value of $R_{off}$ may be controlled by the applied program voltages and currents (e.g., $V_{cell}$ and $I_{cc}$), as discussed above.

Particular waveform and control signal examples have been shown in FIG. 9. However, alternative timing variations and control systems can be employed in particular embodiments. For example, the timing of the modified erase operation and the program operation as shown may be substantially the same, thus providing symmetric program/erase operation. Generally, an erase operation may be faster than a program operation. As such, appending a soft program operation after a strong erase operation can make the modified erase operation of particular embodiments comparable to that of the actual program operation. As a result, symmetric operation can be obtained.

In the operational scheme of particular embodiments, high speed memory arrays in which the program and erase operations are substantially symmetric may be formed. In addition, the program operation can be achieved with a single pulse and in faster time, instead of using multiple program pulses and/or in an adaptive manner in order to handle a high variation in time-to-program values. In particular embodiments, the programming time can effectively be shortened because a lower number of electrodeposits 308 need be formed in order to complete a given conductive path. Also, the variation in time-to-program values may be decreased, thus yielding narrower time-to-program distributions due to controlled erased states (see, e.g., 800).

In addition, particular embodiments may provide a way to control the erased state (state "0"), such as by controlling $V_{cell}$ and $I_{cc}$ for the soft program operation, as discussed above. In this way, the erase operation may be indirectly controlled. Further, the soft program operation may condition the cell and the high state resistance value to a desired lower value in a controlled way. This may not only make the off state resistance (high resistance state) distribution narrower and well controlled, but can also increase the speed in which consecutive program operations can occur. As a result, certain embodiments may allow the programmable impedance element-based storage cell to operate faster.

Also, relatively high performance memory arrays can be achieved by using the modified operation of particular embodiments. This is because regular erase and program operations may increase the difficulty in forming high-performance (high speed) arrays due to higher variation in time-to-program and state resistance values.

It is also noted that, while only two storage states (state "0" and state "1") have been significantly described herein, PMCs may also each support more than one memory state. For example, depending on the voltage level controls, instead of a full erase or a full program/write, partial operations (e.g., by applying less/predetermined voltages for forward bias and reverse bias of the PMC, by applying different program current, etc.) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance, bias voltage, and/or current characteristics.

In order to accommodate more than one memory state in the approach of particular embodiments, voltage and/or current levels may be adjusted for the soft program operation. Thus, instead of forming a consistent value of $R_{off}$ after the soft program operation that follows the strong erase operation, variations in cell programming levels (e.g., $V_{cell}$ and $I_{cc}$) may be utilized in order to form different cell resistance values corresponding to different partial conductive path structures or different strengths of conductive path structures of electrodeposits 308. For example, four different $R_{off}$ values can be seen in examples 400, 500, 520, and 540 of FIG. 5, and these may correspond to different data values (e.g., 011, 010, 001, and 000, respectively) stored in the cell. Particular embodiments can thus employ a soft program operation that can configure different $R_{off}$ values based on a desired multi-bit cell data storage option. In any event, whether single bit or multi-bit data storage is employed, the particular $R_{off}$ values for that given data state may be substantially repeatable and controllable due to the strong erase operation that precedes the soft program operation in particular embodiments.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of operating a programmable impedance element, the method comprising:
    a) determining an operation to be performed on the programmable impedance element, wherein the programmable impedance element comprises a solid electrolyte between an active electrode and an inert electrode;
    b) in response to the determined operation being a program operation, programming the programmable impedance element by completing formation of a conductive path from a partial conductive path between the active and inert electrodes; and
    c) in response to the determined operation being an erase operation, erasing the programmable impedance element by substantially dissolving the conductive path, and then by forming the partial conductive path comprising using a low program compliance current and a high programming voltage on the programmable impedance element.

2. The method of claim 1, wherein the substantially dissolving the conductive path forms a maximum resistance value of the programmable impedance element.

3. The method of claim 2, wherein the forming the partial conductive path forms a predetermined intermediate resistance value of the programmable impedance element, the predetermined intermediate resistance value being less than the maximum resistance value.

4. The method of claim 1, wherein the programming the programmable impedance element comprises applying a first voltage across the active and inert electrodes, the conductive path remaining once formed after the first voltage is removed.

5. The method of claim 1, wherein the forming the partial conductive path comprises:
    a) oxidizing at least a portion of the active electrode to produce ions; and
    b) reducing the ions to form metal electrodeposits.

6. The method of claim 1, wherein the completing the formation of the conductive path comprises:
    a) oxidizing at least a portion of the active electrode to produce ions; and
    b) reducing the ions to form metal electrodeposits.

7. The method of claim 1, wherein the substantially dissolving the conductive path comprises applying a second voltage across the active and inert electrodes.

8. The method of claim 1, wherein the active electrode comprises an electrochemically active metal.

9. A programmable impedance element, comprising:
    a) a solid electrolyte;
    b) an inert electrode coupled to a first side of the solid electrolyte;
    c) an active electrode coupled to a second side of the solid electrolyte, wherein the programmable impedance element is configured to be programmed by completing formation of a conductive path from a partial conductive path between the active and inert electrodes by application of a first voltage across the active and inert electrodes, the conductive path remaining once formed after the first voltage is removed; and
    d) wherein the programmable impedance element is configured to be erased by substantially dissolving the conductive path and then by forming the partial conductive path.

10. The programmable impedance element of claim 9, wherein the conductive path is dissolved by application of a second voltage across the active and inert electrodes.

11. The programmable impedance element of claim 9, wherein the solid electrolyte comprises a chalcogenide compound.

12. The programmable impedance element of claim 9, wherein the partial conductive path comprises metal electrodeposits formed by reduced ions oxidized from at least a portion of the active electrode.

13. The programmable impedance element of claim 9, wherein the conductive path comprises metal electrodeposits formed by reduced ions oxidized from at least a portion of the active electrode.

14. The programmable impedance element of claim 9, wherein the active electrode comprises an electrochemically active metal.

15. A memory cell, comprising:
    a) the programmable impedance element of claim 9; and
    b) a transistor having a drain coupled to the inert electrode.

16. The memory cell of claim 15, wherein the active electrode is coupled to a bit line.

17. The memory cell of claim 15, wherein a gate of the transistor is coupled to a word line.

18. The memory cell of claim 15, wherein a source of the transistor is coupled to a source line.

\* \* \* \* \*